(12) United States Patent
Tsuchida et al.

(10) Patent No.: US 9,408,315 B2
(45) Date of Patent: Aug. 2, 2016

(54) ELECTRONIC APPARATUS

(71) Applicant: Sony Computer Entertainment Inc., Tokyo (JP)

(72) Inventors: Shinya Tsuchida, Tokyo (JP); Yasuhiro Ootori, Kanagawa (JP); Yuta Tamaki, Chiba (JP)

(73) Assignees: Sony Corporation, Tokyo (JP); Sony Interactive Entertainment Inc., Tokyo (JP)

( * ) Notice: Subject to any disclaimer, the term of this patent is extended or adjusted under 35 U.S.C. 154(b) by 86 days.

(21) Appl. No.: 14/289,870

(22) Filed: May 29, 2014

(65) Prior Publication Data

US 2014/0362500 A1 Dec. 11, 2014

(30) Foreign Application Priority Data

Jun. 7, 2013 (JP) .................................. 2013-121342

(51) Int. Cl.
*H05K 5/00* (2006.01)

(52) U.S. Cl.
CPC .................................... *H05K 5/0013* (2013.01)

(58) Field of Classification Search
CPC .................................................... H05K 5/0013
USPC ........................................ 361/679.01–679.09
See application file for complete search history.

(56) References Cited

U.S. PATENT DOCUMENTS

| | | | | |
|---|---|---|---|---|
| 5,931,513 A * | 8/1999 | Conti | ..................... | E05C 19/066 220/324 |
| 6,179,642 B1 * | 1/2001 | Hwang | .............. | H01R 13/5804 439/358 |
| 6,375,283 B1 * | 4/2002 | Kitamura | ............. | H04B 1/3833 292/81 |
| 2006/0089034 A1 * | 4/2006 | Chen | .................... | H05K 5/0013 439/164 |
| 2010/0026148 A1 * | 2/2010 | Zhang | ....................... | G06F 1/18 312/223.2 |
| 2010/0254080 A1 | 10/2010 | Tamaki | | |
| 2013/0027852 A1 * | 1/2013 | Wang | ..................... | G06F 1/184 361/679.01 |

FOREIGN PATENT DOCUMENTS

| | | |
|---|---|---|
| JP | 60-174281 A | 1/1985 |
| JP | H4-87685 A | 1/1992 |
| JP | 2008-122822 A | 5/2008 |

OTHER PUBLICATIONS

Office Action for corresponding JP Application No. 2013-121342, dated Feb. 17, 2015.

* cited by examiner

*Primary Examiner* — Tuan T Dinh
*Assistant Examiner* — Rockshana Chowdhury
(74) *Attorney, Agent, or Firm* — Matthew B. Dernier, Esq.

(57) ABSTRACT

An electronic apparatus includes: a first cover forming a first external surface of the electronic apparatus; a second cover forming the first external surface in conjunction with the first cover, the second cover being capable of being separated from an edge of the first cover in a first direction along the first external surface; an elastically deformable first engaging portion formed at the edge of the first cover; and a second engaging portion formed at an edge of the second cover, the second engaging portion being engageable with the first engaging portion. The first engaging portion is elastically deformable in a second direction intersecting the first direction and being along the first external surface.

12 Claims, 9 Drawing Sheets

ELECTRONIC APPARATUS

BACKGROUND

The present technology relates to an electronic apparatus having an external surface formed by two covers.

U.S. Patent Application Publication No. 2010/0254080 (hereinafter referred to as Patent Document 1) below discloses an electronic apparatus functioning as a game device and an audio-visual apparatus. Some electronic apparatuses include a user-replaceable part. For example, the electronic apparatus of Patent Document 1 includes a hard disk drive. A user may desire to use a hard disk drive having a higher capacity as necessary.

SUMMARY

Consideration has been given to forming one (for example an upper surface) of external surfaces of an electronic apparatus with two covers, and covering a replaceable part such as a hard disk drive or the like with one cover. According to this structure, the inside of the electronic apparatus can be exposed greatly by removing one cover, and therefore the work of replacing the part is facilitated. As a method for connecting the two covers to each other, connecting the two covers to each other by engaging portions formed on internal surfaces of the covers is considered. However, depending on engaging structures, parts included in the electronic apparatus and the engaging portions tend to interfere with each other.

It is desirable to provide an electronic apparatus that can prevent interference between parts disposed inside covers and engaging structures of the two covers.

According to an embodiment of the present technology, there is provided an electronic apparatus including: a first cover forming a first external surface of the electronic apparatus; a second cover forming the first external surface in conjunction with the first cover, the second cover being capable of being separated from an edge of the first cover in a first direction along the first external surface; an elastically deformable first engaging portion formed at the edge of the first cover; and a second engaging portion formed at an edge of the second cover, the second engaging portion being engageable with the first engaging portion. The first engaging portion is elastically deformable in a second direction intersecting the first direction and being along the first external surface.

According to the embodiment of the present technology, the first engaging portion is elastically deformed in the second direction along the first external surface. It is thus possible to prevent interference between parts included in the electronic apparatus and the engaging structures of the two covers.

DETAILED DESCRIPTION OF THE PREFERRED EMBODIMENT

Figure 1:
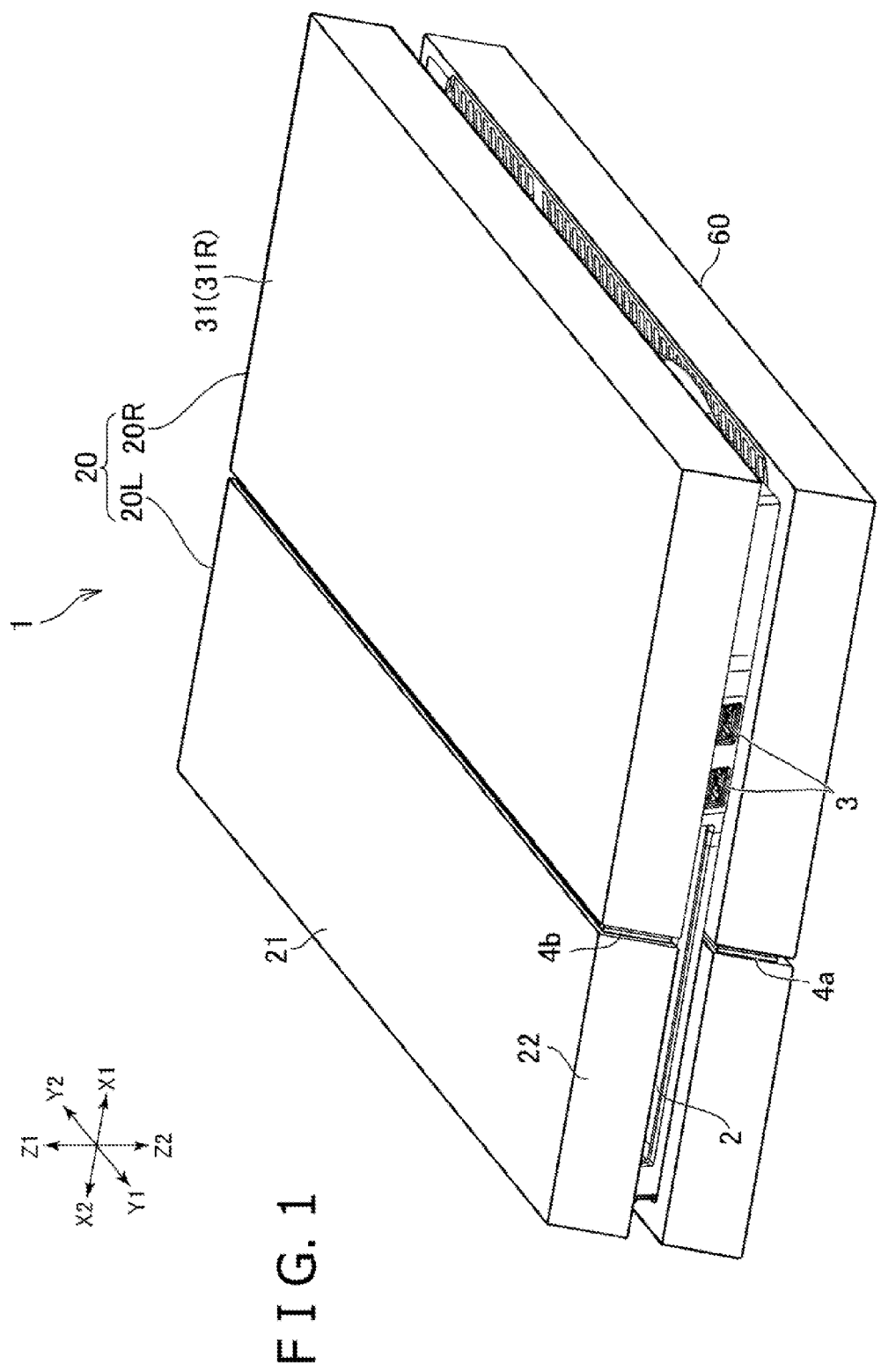
FIG. 1 is a perspective view of an electronic apparatus according to an embodiment of the present technology.
Figure 2:
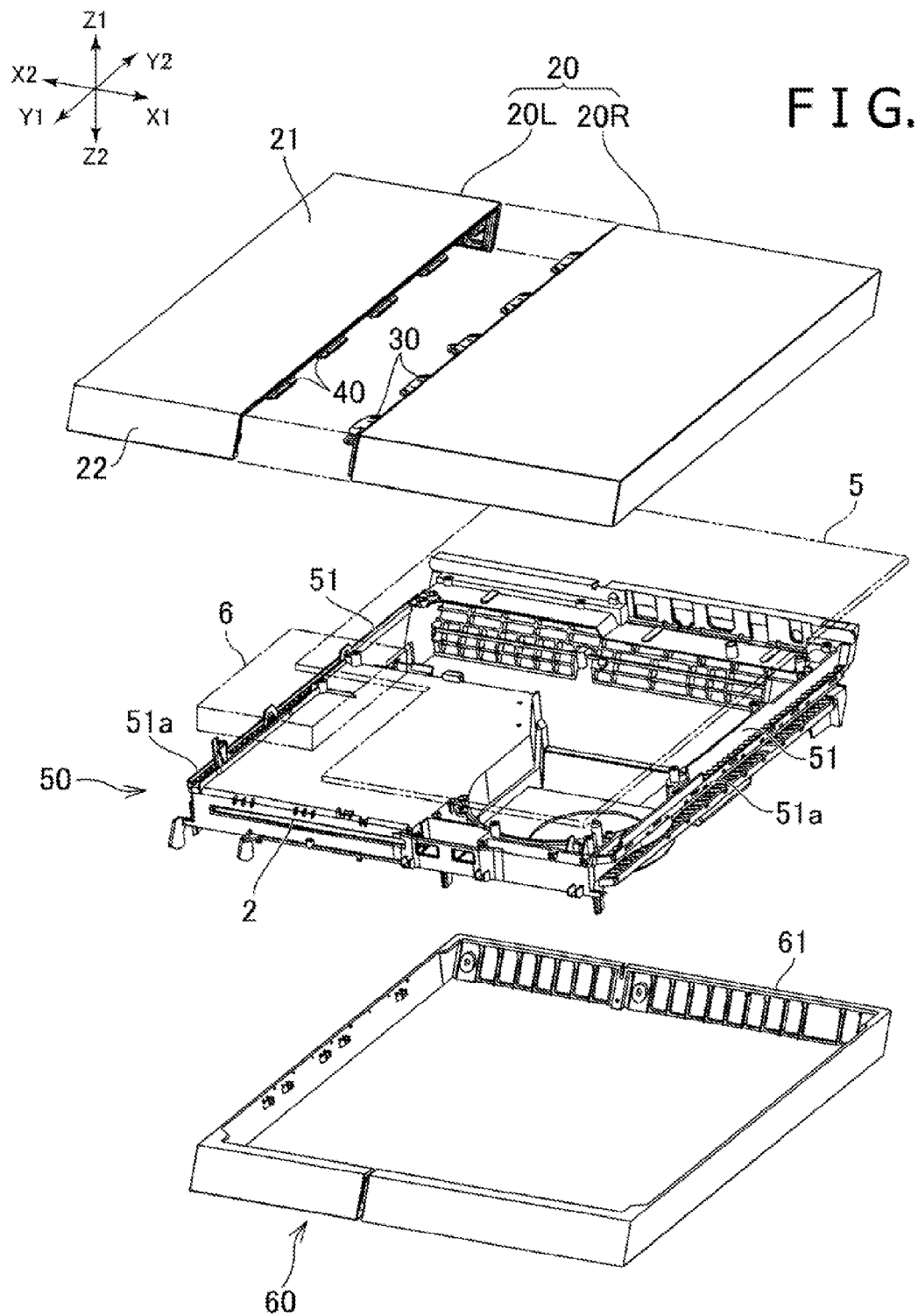
FIG. 2 is an exploded perspective view of the electronic apparatus.
Figure 3:
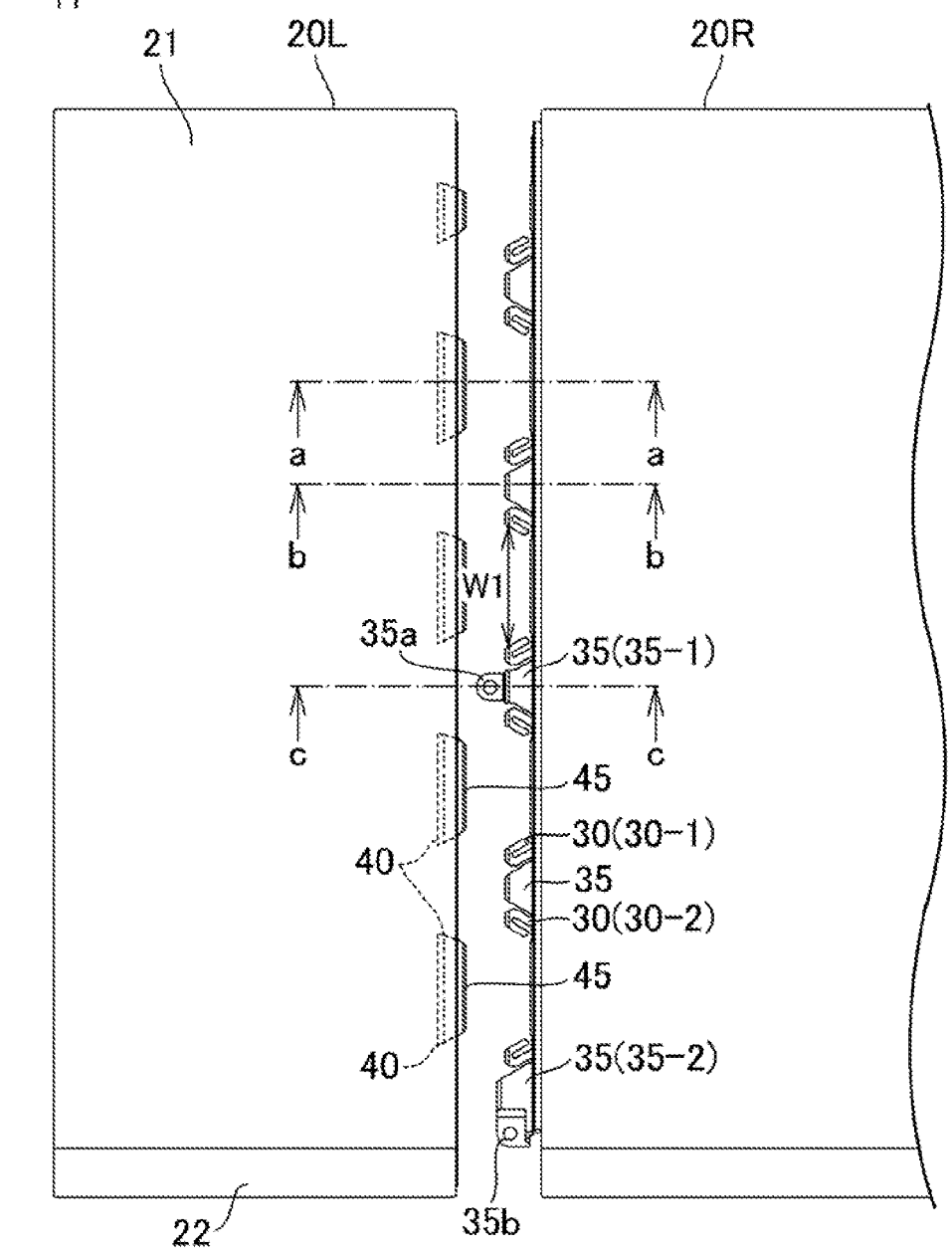
FIG. 3 is a plan view of covers of the electronic apparatus.

A preferred embodiment of the present technology will hereinafter be described with reference to the drawings. FIG. 1 is a perspective view of an electronic apparatus 1 according to the embodiment of the present technology. FIG. 2 is an exploded perspective view of the electronic apparatus 1. FIG. 3 is a plan view of a right cover 20R and a left cover 20L of the electronic apparatus 1. In the following description, X1 and X2 shown in these figures represent a right direction and a left direction, respectively, Y1 and Y2 represent a forward direction and a rearward direction, respectively, and Z1 and Z2 represent an upward direction and a downward direction, respectively.

The electronic apparatus 1 is an entertainment device functioning as a game device and an audio-visual apparatus. The electronic apparatus 1 outputs moving image data generated by executing a game program, video and audio data obtained from a recording medium such as an optical disk or the like, and/or video and audio data obtained through a network to a display device such as a television set or the like. As shown in FIG. 1, an insertion slot 2 for inserting an optical disk and a connector 3 for connecting a device such as a controller or the like are provided in a front surface of the electronic apparatus 1. In addition, a power button 4b and an optical disk ejecting button 4a are provided in the front surface of the electronic apparatus 1.

As shown in FIG. 2, the electronic apparatus 1 has an upper cover 20 and a lower cover 60 as members forming an external surface of the electronic apparatus 1. The electronic apparatus 1 in the example described here further has a frame 50. Various devices included in the electronic apparatus 1, such as a circuit board 5, a power supply unit (not shown), an optical disk drive device, and the like, are attached to the frame 50. The upper cover 20 and the lower cover 60 cover an upper side and a lower side, respectively, of the frame 50, and are attached to the frame 50.

The upper cover 20 forms an upper surface of the electronic apparatus 1. The upper cover 20 has a right cover 20R (first cover) and a left cover 20L (second cover). These covers can be separated from each other in a direction along the upper surface of the electronic apparatus 1 (that is, in a direction along upper surfaces of the covers 20R and 20L). In the example described here, the direction along the upper surface is a left-right direction. The left cover 20L can be separated in a left direction from an edge of the right cover 20R in a state of the right cover 20R being fixed to a main body (that is, the frame 50) of the electronic apparatus 1. As will be described later in detail, engaging portions 40 and 30 engageable with each other are formed at an edge of the left cover 20L and an edge of the right cover 20R, respectively. The left cover 20L can be separated from the right cover 20R and removed from the electronic apparatus 1 by releasing the engagement of the engaging portions 40 and 30 with each other.

A user-replaceable part is disposed on the upper side of the frame 50. The replaceable part is for example a hard disk drive 6 shown in FIG. 2. The circuit board 5 is attached to the upper side of the frame 50. The hard disk drive 6 is connected to a connector (not shown) provided to the circuit board 5. The hard disk drive 6 is disposed in a left side portion of the electronic apparatus 1, and is covered by the left cover 20L. The hard disk drive 6 in the example described here is disposed on a front side in particular. A user can replace the hard disk drive 6 by removing the left cover 20L. Incidentally, the user-replaceable part is not limited to the hard disk drive 6.

As shown in FIG. 3, the left cover 20L and the right cover 20R have respective edges facing each other. That is, the right edge of the left cover 20L and the left edge of the right cover 20R face each other. These edges extend linearly in a forward-rearward direction. The left cover 20L is provided with a plurality of engaging portions 40 arranged along the edge of the left cover 20L. In the example described here, a plurality of projecting portions 45 are formed on the lower surface of the left cover 20L. End portions of each of the projecting portions 45 function as engaging portions 40 (end portions in this case refer to end portions in the extending direction of the edge of the left cover 20L (forward-rearward direction)). That is, engaging portions 40 are provided at front ends and rear ends of the projecting portions 45.

The right cover 20R has a plurality of elastically deformable engaging portions 30 arranged along the edge of the right cover 20R. The engaging portions 30 can be elastically deformed in a direction that intersects the left-right direction and is along the upper surface of the electronic apparatus 1. In the example described here, the direction along the upper surface of the electronic apparatus 1 is the forward-rearward direction. That is, the engaging portions 30 can be elastically deformed in the forward-rearward direction (extending direction of the edge of the right cover 20R). The elastic deformation of the engaging portions 30 allows engagement of the engaging portions 30 with the engaging portions 40 of the left cover 20L and release of the engagement (in the following, the engaging portions 30 will be referred to as first engaging portions, and the engaging portions 40 will be referred to as second engaging portions).

Two first engaging portions 30 elastically deformed in opposite directions from each other form a pair. Referring to FIG. 3, a first engaging portion 30-1 and a first engaging portion 30-2 form a pair (in the following, this pair will be referred to as an engaging portion pair). The first engaging portion 30-1 is elastically deformed in one of two directions parallel with the extending direction of the edge of the right cover 20R and opposite from each other. The first engaging portion 30-2 is elastically deformed in the other of the two directions. Specifically, the first engaging portion 30-1 is elastically deformed in a forward direction, and the first engaging portion 30-2 is elastically deformed in a rearward direction. The right cover 20R is provided with a plurality of engaging portion pairs arranged in the forward-rearward direction.

A plurality of projecting portions 35 arranged in the forward-rearward direction are formed at the edge of the right cover 20R. The first engaging portion 30-1 is provided on a rear side of a projecting portion 35, and the first engaging portion 30-2 is provided on a front side of the projecting portion 35. In the following, in description in which the first engaging portion 30-1 located on the rear side of each projecting portion 35 and the first engaging portion 30-2 located on the front side of each projecting portion 35 are not distinguished from each other, these first engaging portions will be referred to simply as first engaging portions 30. Incidentally, in the example of FIG. 3, a first engaging portion 30 located at a foremost position among the plurality of first engaging portions 30 is not provided with a first engaging portion 30 with which to form a pair.

The position of the projecting portions 45 of the left cover 20L is shifted with respect to the projecting portions 35 of the right cover 20R in the forward-rearward direction. Hence, the second engaging portion 40 located on the front side of the projecting portion 45 is engaged with the first engaging portion 30-1 on the rear side of the projecting portion 35. The second engaging portion 40 located on the rear side of the projecting portion 45 is engaged with the first engaging portion 30-2 on the front side of the projecting portion 35. A force in the forward-rearward direction which force the first engaging portion 30-1 on the rear side of the projecting portion 35 receives from the second engaging portion 40 and a force in the forward-rearward direction which force the first engaging portion 30-2 on the front side of the projecting portion 35 receives from the second engaging portion 40 are in opposite directions from each other. In a state in which the edge of the left cover 20L and the edge of the right cover 20R are connected to each other (in a state in which the first engaging portions 30 are engaged with the second engaging portions 40), the projecting portions 45 and the projecting portions 35 are located on the lower side of the edges of the covers 20L and 20R, and are arranged alternately in the forward-rearward direction (extending direction of the edges). Forces necessary for connecting and separating the left cover 20L and the right cover 20R to and from each other can be adjusted by adjusting the number of projecting portions 45 and 35, the length of the projecting portions 35 in the forward-rearward direction (distance between two first engaging portions 30 provided to the projecting portion 35), and the length of the projecting portions 45 in the forward-rearward direction (distance between two second engaging portions 40 provided to the projecting portion 45).

Thus, the first engaging portions 30 are elastically deformed in the forward-rearward direction rather than in the upward-downward direction. Therefore, interference between the first engaging portions 30 and parts covered by the covers 20R and 20L can be prevented when the left cover 20L is connected to the right cover 20R. In addition, because the right cover 20R is provided with a plurality of engaging portion pairs, the strength of connection between the right cover 20R and the left cover 20L can be improved while the width in the forward-rearward direction of the right cover 20R and the left cover 20L is increased.

Figure 4:
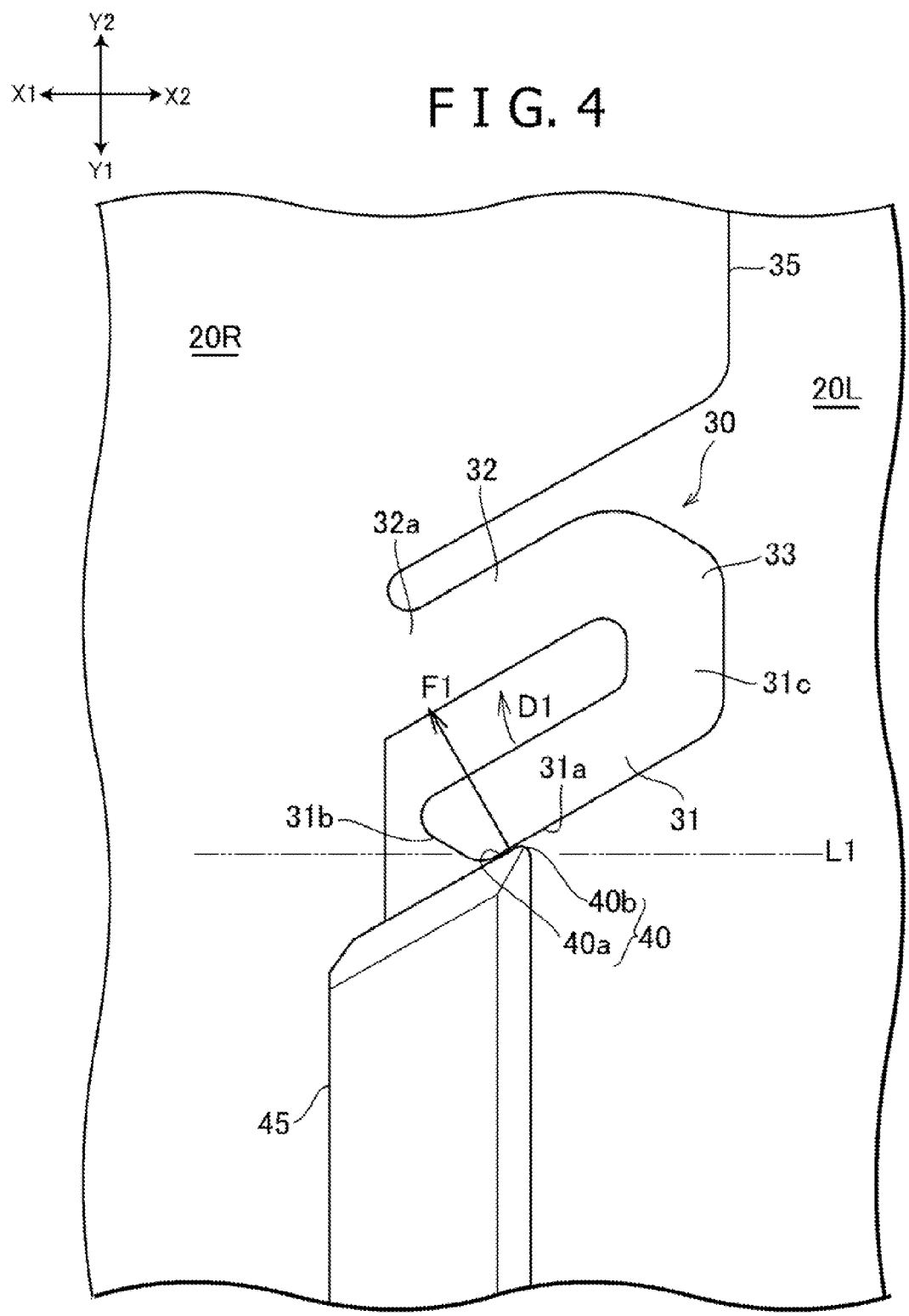
FIG. 4 is a diagram of assistance in explaining the engaging structures of the covers.
Figure 5:
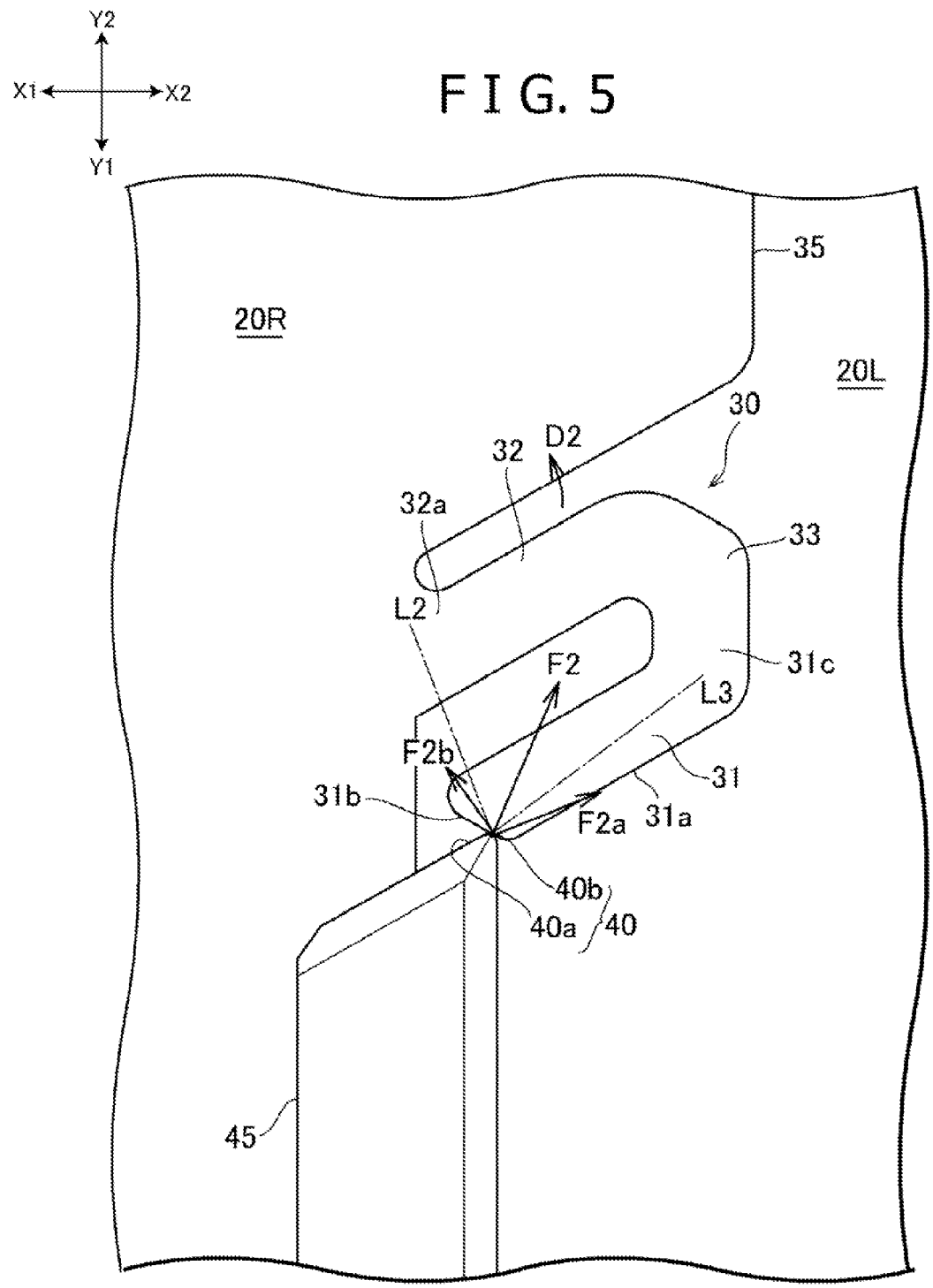
FIG. 5 is a diagram of assistance in explaining the engaging structures of the covers.

FIG. 4 and FIG. 5 are diagrams of assistance in explaining the engaging structures of the covers 20R and 20L. The diagrams show the edges of undersurfaces of the covers 20R and 20L. FIG. 4 shows a state immediately before engaging portions 30 and 40 are engaged with each other. FIG. 5 shows a state after the engaging portions 30 and 40 are engaged with each other.

As shown in FIG. 4, the first engaging portion 30 has a first elastic inclining portion 31 and a second elastic inclining portion 32. The first elastic inclining portion 31 has a first abutting surface 31*a* and a second abutting surface 31*b*. The first abutting surface 31*a* and the second abutting surface 31*b* are located in a course L1 of movement of the second engaging portion 40 when the left cover 20L moves relative to the right cover 20R. The first abutting surface 31*a* is a surface that the second engaging portion 40 abuts against when the left cover 20L approaches the right cover 20R (see FIG. 4). The second abutting surface 31*b* is a surface that the second engaging portion 40 abuts against when the left cover 20L moves in a direction of going away from the right cover 20R in a state in which the first engaging portion 30 and the second engaging portion 40 are engaged with each other (see FIG. 5). Here, the state in which the first engaging portion 30 and the second engaging portion 40 are engaged with each other is a state in which the edges of the two covers 20R and 20L abut against each other, or in other words a state in which a projecting portion 45 is fitted between two projecting portions 35 adjacent to each other. As described above, the end portions of the projecting portions 45 function as second engaging portions 40. The second engaging portion 40 in the example described here has an abutting portion 40a, which is an end surface of the projecting portion 45, and an abutting portion 40b, which is a corner of the projecting portion 45. The abutting portion 40a abuts against the first abutting surface 31a of the first engaging portion 30, and the abutting portion 40b abuts against the second abutting surface 31b (see FIG. 5).

The first elastic inclining portion 31 is formed so as to incline in the forward-rearward direction when the second engaging portion 40 presses the first abutting surface 31a. Specifically, as indicated by an arrow D1 in FIG. 4, the first elastic inclining portion 31 of the first engaging portion 30-2 provided on the front side of the projecting portion 35 is formed so as to incline rearward. Conversely, the first elastic inclining portion 31 of the first engaging portion 30-1 provided on the rear side of the projecting portion 35 is formed so as to incline forward. The second elastic inclining portion 32 is formed so as to incline in the forward-rearward direction when the second engaging portion 40 presses the second abutting surface 31b. Specifically, as indicated by an arrow D2 in FIG. 5, the second elastic inclining portion 32 of the first engaging portion 30-2 provided on the front side of the projecting portion 35 is formed so as to incline rearward. Conversely, the second elastic inclining portion 32 of the first engaging portion 30-1 provided on the rear side of the projecting portion 35 is formed so as to incline forward.

The first engaging portion 30 is thus provided with two elastic inclining portions 31 and 32. This facilitates adjustment of a balance between a force necessary to engage the engaging portions 30 and 40 with each other and a force necessary to release the engagement as compared with a case where the first engaging portion 30 is provided with only one elastic inclining portion. For example, when the modulus of elasticity of the first elastic inclining portion 31 is decreased while the modulus of elasticity of the second elastic inclining portion 32 is maintained, the force necessary for the engagement can be reduced while a change in the force necessary to release the engagement is prevented.

The first engaging portion 30 in the example described here is specifically formed as follows. As shown in FIG. 4, the second elastic inclining portion 32 has a base portion 32a connected to the edge of the right cover 20R at one end portion of the second elastic inclining portion 32. The second elastic inclining portion 32 can elastically incline with the base portion 32a as a center of inclination. The first elastic inclining portion 31 has a base portion 31c connected to another end portion of the second elastic inclining portion 32. The first elastic inclining portion 31 and the second elastic inclining portion 32 are arranged in substantially the shape of a U. That is, the base portion 31c of the first elastic inclining portion 31 is connected to the second elastic inclining portion 32 via a bent portion 33. In the example described here, the second elastic inclining portion 32 extends in a direction of going away from the edge of the right cover 20R (left direction), and the first elastic inclining portion 31 extends from the end portion of the second elastic inclining portion 32 toward the edge of the right cover 20R. The first elastic inclining portion 31 and the second elastic inclining portion 32 are formed so as to be substantially parallel with the flat surface formed by the covers 20R and 20L (upper surface of the electronic apparatus 1). In the example described here, the second elastic inclining portion 32 extends obliquely with respect to a direction orthogonal to the edge of the right cover 20R (left-right direction) in an initial state of the second elastic inclining portion 32 (state in which no force acts from the second engaging portion 40 on the abutting surfaces 31a and 31b). Similarly, the first elastic inclining portion 31 extends obliquely with respect to the direction orthogonal to the edge of the right cover 20R (left-right direction) in an initial state of the first elastic inclining portion 31 (state in which no force acts from the second engaging portion 40 on the abutting surfaces 31a and 31b). The first elastic inclining portions 31 of two first engaging portions 30 forming a pair are inclined such that an interval between the first elastic inclining portions 31 is gradually increased toward the edge of the right cover 20R. Similarly, the second elastic inclining portions 32 of the two first engaging portions 30 forming the pair are inclined such that an interval between the second elastic inclining portions 32 is gradually increased toward the edge of the right cover 20R. The first elastic inclining portion 31 and the second elastic inclining portion 32 are substantially parallel with each other.

The first elastic inclining portion 31 has the first abutting surface 31a as a side surface on an opposite side from the second elastic inclining portion 32. The first abutting surface 31a is substantially parallel with the extending direction of the first elastic inclining portion 31. Therefore, as shown in FIG. 4, when the second engaging portion 40 presses the first abutting surface 31a with a force F1, a moment corresponding to the force F1 occurs around the base portion 31c of the first elastic inclining portion 31. Therefore, the first elastic inclining portion 31 elastically inclines with the base portion 31c as a center of inclination. The second engaging portion 40 is formed so as to abut against the first abutting surface 31a at a position on an end portion side of the first elastic inclining portion 31. This can reduce the force necessary to engage the engaging portions 30 and 40 with each other.

The base portion 32a of the second elastic inclining portion 32 is located in substantially the direction of the force F1 with respect to the first abutting surface 31a. In other words, a straight line perpendicular to the first abutting surface 31a, which straight line passes through a point of contact between the first abutting surface 31a and the second engaging portion 40, passes through the base portion 32a. Therefore, the occurrence of a moment around the base portion 32a due to the force F1 is prevented. Hence, the force necessary to engage the engaging portions 30 and 40 with each other (force necessary to connect the right cover 20R and the left cover 20L to each other) can be adjusted mainly by the length of the first elastic inclining portion 31, the thickness of the base portion 31c, and the angle of the first abutting surface 31a (angle with the movement course L1).

The second abutting surface 31b is located away from the base portion 32a of the second elastic inclining portion 32. In addition, as shown in FIG. 5, the angle of the second abutting surface 31b with respect to the movement course L1 is set such that a force F2a perpendicular to a straight line L2 occurs when the second engaging portion 40 presses the second abutting surface 31b. The straight line L2 connects the base portion 32a to a point of contact between the second abutting surface 31b and the second engaging portion 40. The force F2a is a component of a force F2 with which the second engaging portion 40 presses the second abutting surface 31b, which component is in a direction perpendicular to the straight line L2. Therefore, when the second engaging portion 40 presses the second abutting surface 31b, a moment around the base portion 32a occurs, and thus the second elastic inclining portion 32 elastically inclines as indicated by an arrow D2. Hence, unlike to the force necessary to connect the right cover 20R and the left cover 20L to each other, the force necessary to separate the right cover 20R and the left cover 20L from each other can be adjusted by a distance from the base portion 32a of the second elastic inclining portion 32 to the second abutting surface 31b, the thickness of the base portion 32a, and the angle of the second abutting surface 31b with respect to the movement course L1. Hence, it becomes easy to adjust a balance between the force necessary to separate the left cover 20L and the right cover 20R from each other (force necessary to release the engagement of the engaging portions 30 and 40 with each other) and the force necessary to connect the left cover 20L and the right cover 20R to each other (force necessary for the engagement).

In the example of FIG. 5, the angle of the second abutting surface 31b with respect to the movement course L1 is set such that a force component F2b occurs when the second engaging portion 40 presses the second abutting surface 31b. The force component F2b is a component of the force F2. The force component F2b is perpendicular to a straight line L3 connecting a point of contact between the second abutting surface 31b and the second engaging portion 40 to the base portion 31c of the first elastic inclining portion 31. This force F2b produces a relatively small moment around the base portion 31c of the first elastic inclining portion 31. Therefore, as will be described in a subsequent example, the engagement of the first engaging portion 30 and the second engaging portion 40 with each other can be released even in a structure without the second elastic inclining portion 32.

The projecting portion 45 formed on the left cover 20L is disposed between two first engaging portions 30 adjacent to each other. The first elastic inclining portion 31 is inclined such that an interval W1 (FIG. 3) in the forward-rearward direction between the first elastic inclining portions 31 of the two first engaging portions 30 adjacent to each other is gradually increased from the end portions of the first elastic inclining portions 31 to the base portions 31c. Therefore, when the left cover 20L is connected to the right cover 20R, the projecting portion 45 is guided by the first elastic inclining portions 31 of the two first engaging portions 30. In addition, the projecting portion 45 formed on the left cover 20L has the abutting portion 40a at an end surface of the projecting portion 45 (see FIG. 4 or FIG. 5). The abutting portion 40a is inclined such that the width in the forward-rearward direction of the projecting portion 45 decreases toward the right cover 20R. This facilitates the fitting of the projecting portion 45 between the two first engaging portions 30 when the left cover 20L is connected to the right cover 20R.

Figure 6A:
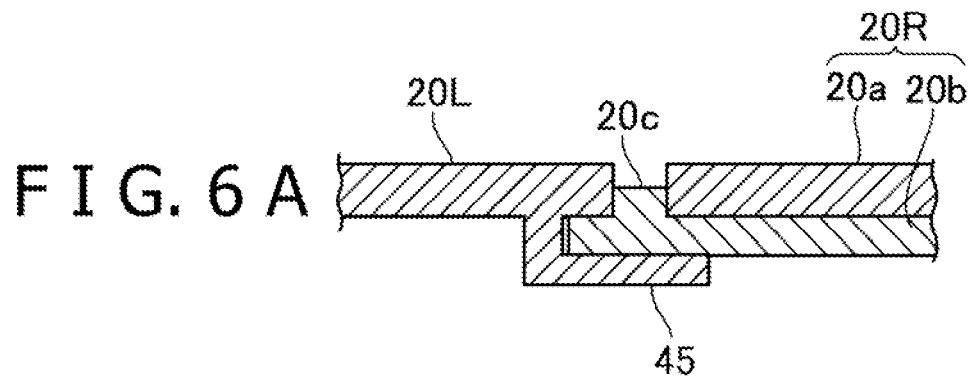
FIGS. 6A, 6B, and 6C are sectional views of edges of the covers in a state in which the covers are connected to each other.
Figure 6B:
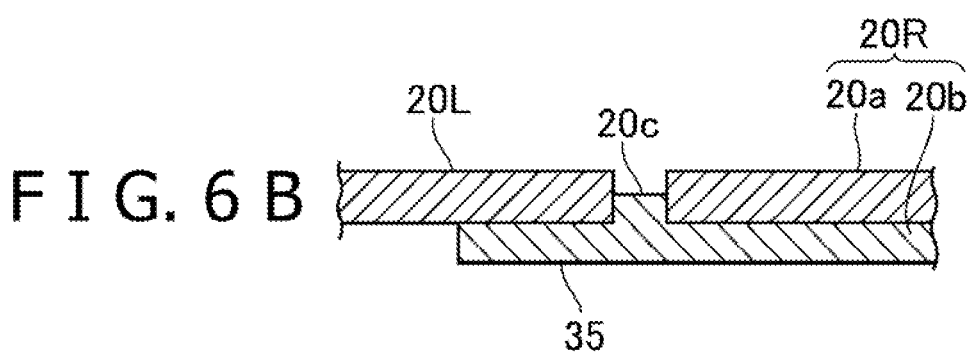
Figure 6C:
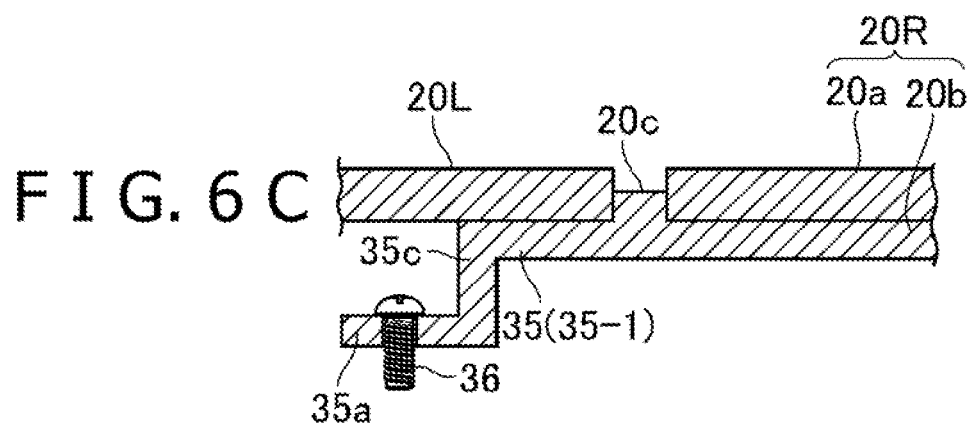

FIGS. 6A, 6B, and 6C are sectional views of the right cover 20R and the left cover 20L in a state of being connected to each other. The section of FIG. 6A is taken along a line a-a of FIG. 3. The section of FIG. 6B is taken along a line b-b of FIG. 3. The section of FIG. 6C is taken along a line c-c of FIG. 3. Incidentally, in the example described here, as shown in FIGS. 6A to 6C, the right cover 20R has a two-layer structure. Specifically, the right cover 20R has an upper side member 20a forming the external surface of the electronic apparatus 1 and a lower side member 20b attached to the undersurface of the upper side member 20a. The projecting portions 35 and the first engaging portions 30 described above are formed in the lower side member 20b. The upper side member 20a and the lower side member 20b are different from each other in color, for example. The lower side member 20b has a part 20c located between the left cover 20L and the upper side member 20a. Incidentally, the right cover 20R may not necessarily have a two-layer structure.

As shown in FIG. 6A, the projecting portion 45 is formed on the undersurface of the left cover 20L. The projecting portion 45 has a section in substantially the shape of an L. The projecting portion 45 extends beyond the edge of the left cover 20L to the lower side of the right cover 20R to support the right cover 20R. As shown in FIG. 6B, the projecting portion 35 extends beyond the edge of the right cover 20R to the lower side of the left cover 20L to support the left cover 20L. The projecting portions 45 and 35 are formed so as to be parallel with the covers 20L and 20R.

Thus, the projecting portion 35 supports the left cover 20L on the lower side of the left cover 20L, and the projecting portion 45 supports the right cover 20R on the lower side of the right cover 20R. Therefore, the occurrence of a gap between the two covers 20R and 20L can be prevented when the upper side of one of the covers 20R and 20L is pressed. In addition, the engaging portions 30 and 40 engaged with each other are located on each of the front side and the rear side of the projecting portions 35 and 45. This can prevent the occurrence of the gap between the two covers 20R and 20L more effectively.

An attaching portion to be fixed to the main body (frame 50 in the present example) of the electronic apparatus 1 is formed at least one of the plurality of projecting portions 35 provided to the right cover 20R. In the example shown in FIG. 3, attaching portions 35a and 35b are provided respectively to the projecting portion 35-1 located at a center in the forward-rearward direction and the projecting portion 35-2 located at the foremost position. The attaching portions 35a and 35b are fixed to the main body (for example the frame 50) of the electronic apparatus 1 by screws 36. The projecting portions 35-1 and 35-2 are connected to the attaching portions 35a and 35b via wall portions 35c extending in the upward-downward direction (direction of thickness of the covers 20R and 20L) (see FIG. 6C). The projecting portions 35-1 and 35-2 are thereby supported by the wall portions 35c. Thus, even when the upper side of the covers 20R and 20L is pressed, the recessing of the covers 20R and 20L can be prevented. In addition, the attaching portions 35a and 35b are provided to the projecting portions 35, and are covered by the left cover 20L. That is, the exposure of the structure for attaching the right cover 20R to the main body of the electronic apparatus 1 can be prevented.

Figure 7:
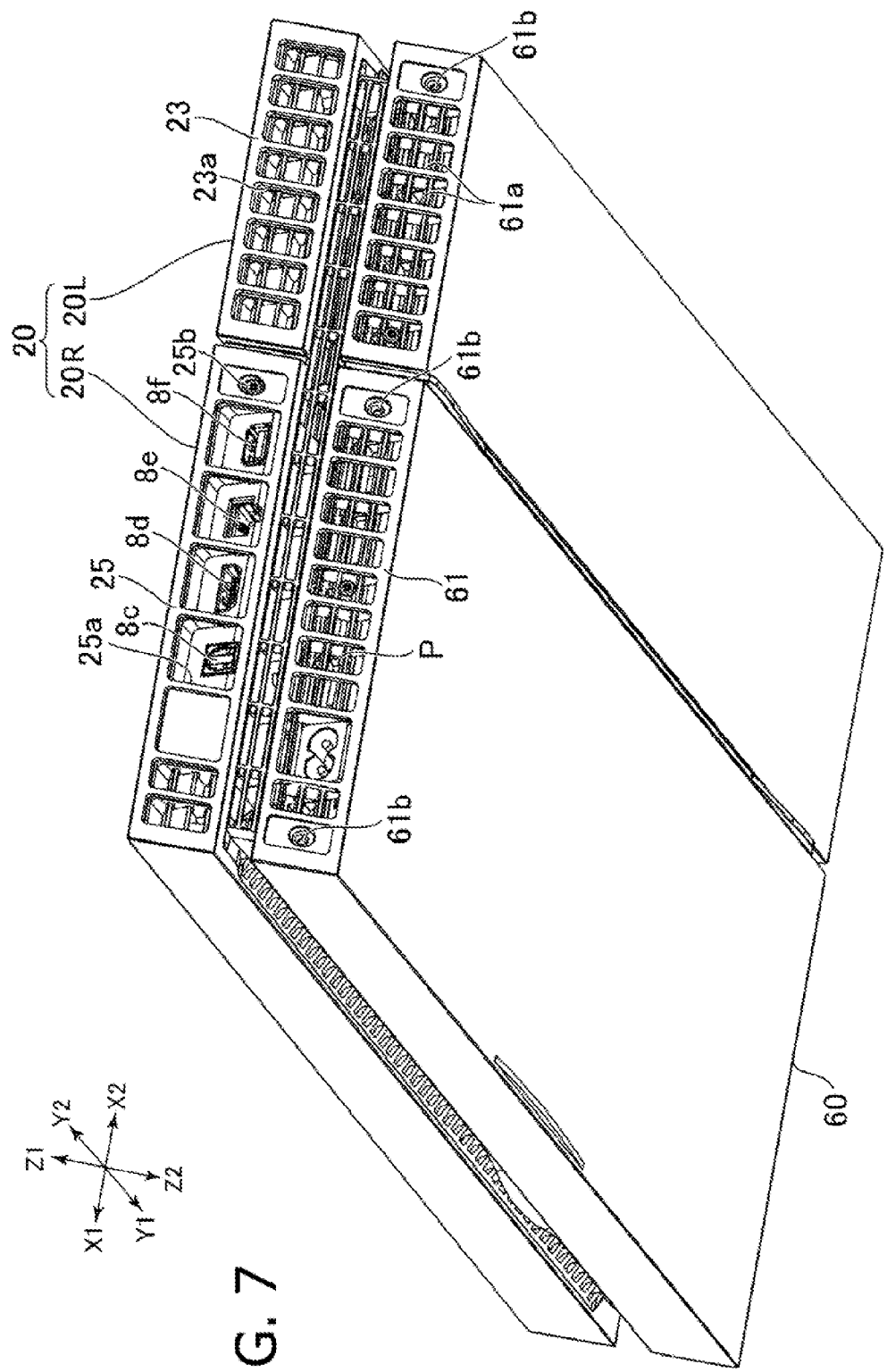
FIG. 7 is a perspective view of the rear side of the electronic apparatus.
Figure 8:
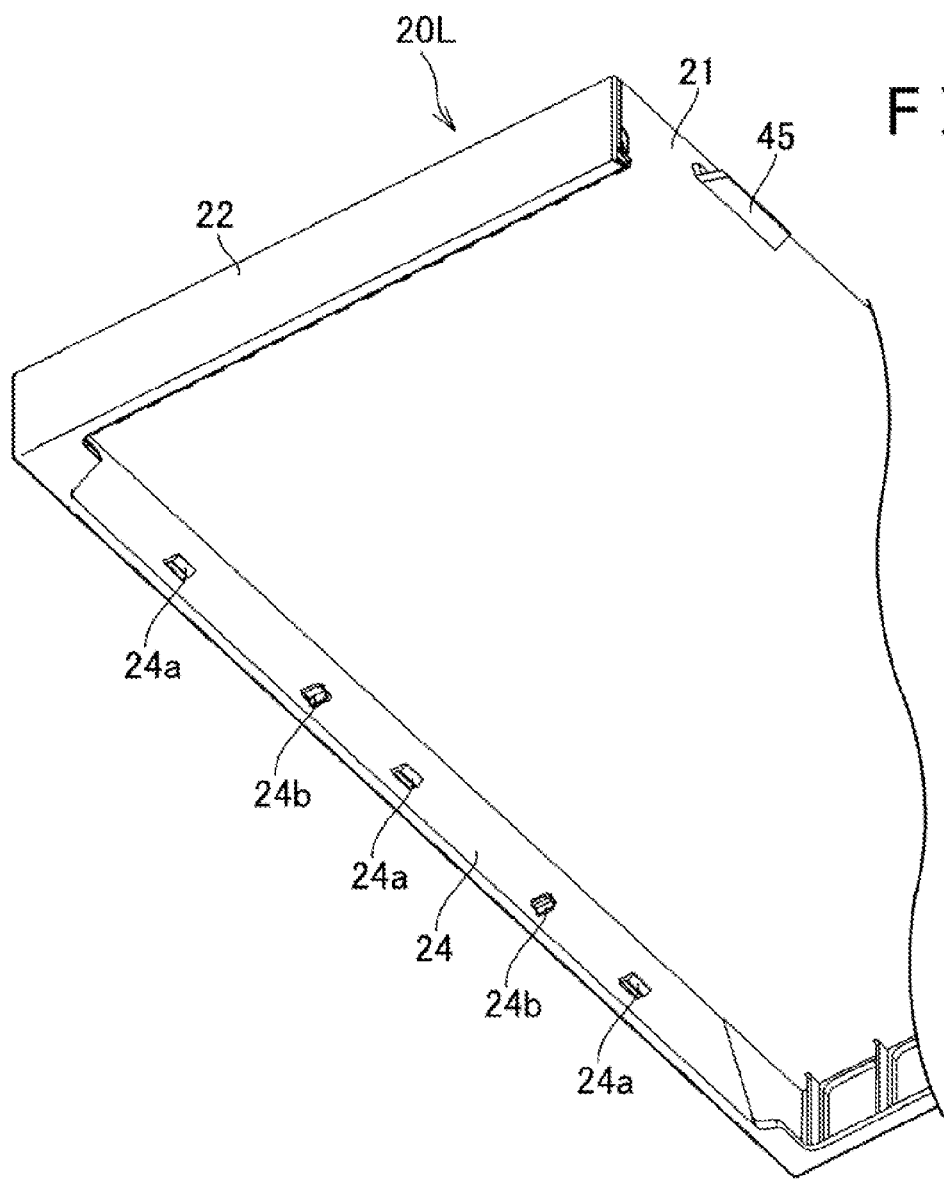
FIG. 8 is a perspective view of the lower side of the left cover.

FIG. 7 is a perspective view of the rear side of the electronic apparatus 1. FIG. 8 is a perspective view of the left cover 20L as viewed from the lower side.

The left cover 20L has an upper surface portion 21 forming the upper surface of the electronic apparatus 1 and having the above-described second engaging portions 40 formed thereon. The left cover 20L also has a front surface portion 22 forming a front surface (surface connected to the front edge of the upper surface) of the electronic apparatus 1 and a side surface portion 24 (see FIG. 8) forming a side surface (surface connected to the left edge of the upper surface) of the electronic apparatus 1. Therefore, a larger part is exposed when the left cover 20L is removed. The work of replacing the hard disk drive 6 is thus facilitated. In the present example, in particular, the left cover 20L also has a rear surface portion 23 (see FIG. 7) forming a rear surface (surface connected to the rear edge of the upper surface) of the electronic apparatus 1. That is, the left cover 20L has the shape of a box with a lower surface and a right side surface opened. This further facilitates the work of replacing the hard disk drive 6.

As shown in FIG. 8, a plurality of engaging portions 24a (three engaging portions 24a in FIG. 8) and a plurality of positioning portions 24b (two positioning portions 24b in FIG. 8) are formed on the internal surface of the side surface portion 24 (engaging portions 24a will hereinafter be referred to as third engaging portions). The third engaging portions 24a and the positioning portions 24b project to the inside from the side surface portion 24. The third engaging portions 24a are engaged with the frame 50. Specifically, the frame 50 has a left and a right side wall portion 51 (see FIG. 2). The left and right side wall portions 51 have a projecting portion 51a projecting to the outside in the left-right direction. The side surface portion 24 of the left cover 20L is disposed along the projecting portion 51a of the left side wall portion 51. The third engaging portions 24a are engaged with an upper edge of the projecting portion 51a. The third engaging portions 24a in the example of FIG. 8 are formed so as to be elastically deformable in the upward-downward direction. The projecting portion 51a of the frame 50 has holes at positions corresponding to the positioning portions 24b. The holes correspond to the size of the positioning portions 24b. The rattling of the side surface portion 24 can be prevented by fitting the positioning portions 24b into the holes. By moving the left cover 20L toward the right cover 20R in the right direction, the second engaging portions 40 are engaged with the first engaging portions 30, the third engaging portions 24a are engaged with the upper edge of the projecting portion 51a, and the positioning portions 24b are fitted into the holes formed in the frame 50.

As described above, the second engaging portions 40 formed on the upper surface portion 21 are engaged with the right cover 20R fixed to the main body (frame 50) of the electronic apparatus 1, and the engaging portions 24a formed on the side surface portion 24 are engaged with the main body (frame 50) of the electronic apparatus 1. Such a layout of the engaging portions 40 and 24a can reduce the number of fixtures (for example screws) for fixing the left cover 20L. In the example described here, fixtures such as screws or the like are not used to fix the left cover 20L. Hence, the user can remove the left cover 20L by releasing the engagement of the engaging portions 30 and 40 with each other and the engagement of the third engaging portions 24a and the frame 50 with each other.

Incidentally, as shown in FIG. 7, the lower cover 60 and the right cover 20R also have respective rear surface portions 61 and 25 forming the rear surface of the electronic apparatus 1. Unlike the left cover 20L, the lower cover 60 and the right cover 20R are fixed to the main body of the electronic apparatus 1 by fixtures such as screws or the like. In the example described here, attaching holes 61b into which to insert screws for fixing the rear surface portion 61 of the lower cover 60 to the frame 50 are formed in the rear surface portion 61. An attaching hole 25b into which to insert a screw for fixing the rear surface portion 25 of the right cover 20R to the frame 50 is formed in the rear surface portion 25.

As shown in FIG. 7, a plurality of openings 61a for exposing exhaust holes P of the electronic apparatus 1 are formed in the rear surface portion 61 of the lower cover 60. A plurality of openings 25a for exposing connectors 8c to 8f provided to the rear surface of the electronic apparatus 1 are formed in the rear surface portion 25 of the right cover 20R. A plurality of openings 23a are also formed in the rear surface portion 23 of the left cover 20L. The openings 23a may not necessarily be formed.

Figure 9:
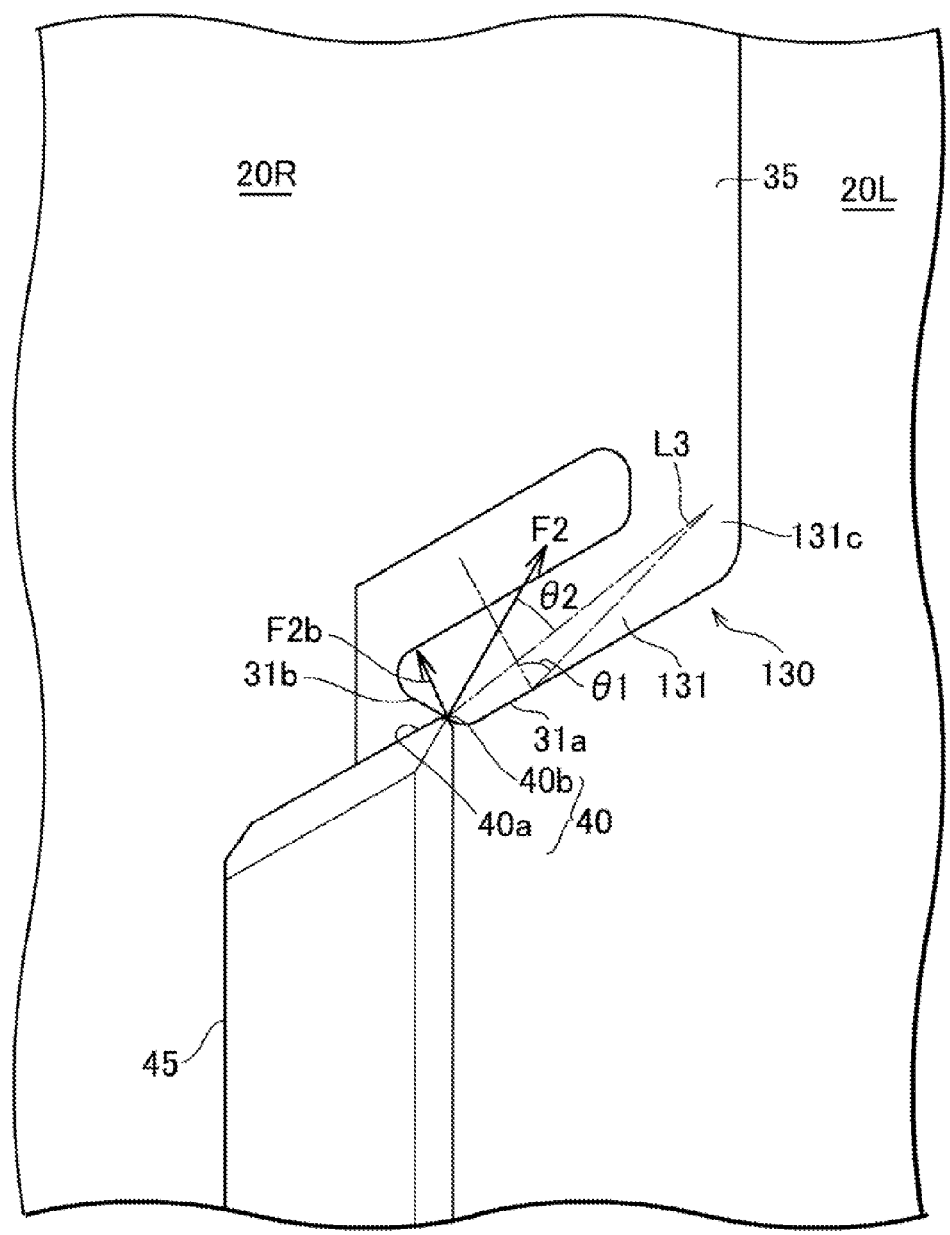
FIG. 9 is a diagram showing a modification of an engaging portion.

FIG. 9 is a diagram showing a modification of the first engaging portion 30. FIG. 9 shows a state in which a first engaging portion 130 is engaged with the second engaging portion 40.

Unlike the above-described first engaging portions 30, the first engaging portion 130 does not have the second elastic inclining portion 32. A base portion 131c of a first elastic inclining portion 131 is connected to an end portion in the forward-rearward direction of the projecting portion 35. The first elastic inclining portion 131 extends from the projecting portion 35 toward the edge of the right cover 20R. The first elastic inclining portion 131 has the first abutting surface 31a and the second abutting surface 31b described above.

When the second engaging portion 40 presses the first abutting surface 31a, a moment corresponding to the force occurs around the base portion 131c of the first elastic inclining portion 131. Therefore, the first elastic inclining portion 131 elastically inclines with the base portion 131c as a center of inclination. As described above, the angle of the second abutting surface 31b is set such that a force component F2b occurs when the second engaging portion 40 presses the second abutting surface 31b. This force F2b produces a moment around the base portion 131c of the first elastic inclining portion 131. Therefore, the first elastic inclining portion 131 elastically inclines with the base portion 131c as a center of inclination also when the second engaging portion 40 presses the second abutting surface 31b.

The second abutting surface 31b is formed such that the force necessary to connect the right cover 20R and the left cover 20L to each other (force necessary to engage the second engaging portion 40 and the first engaging portion 130 with each other) is smaller than the force necessary to separate the right cover 20R and the left cover 20L from each other (force necessary to release the engagement). Let $\theta 1$ be an angle formed between a straight line connecting a point of contact between the first abutting surface 31a and the second engaging portion 40 to the base portion 131c of the first elastic inclining portion 131 and a line perpendicular to the first abutting surface 31a. Let $\theta 2$ be an angle formed between a straight line connecting a point of contact between the second abutting surface 31b and the second engaging portion 40 to the base portion 131c of the first elastic inclining portion 131 and a line perpendicular to the second abutting surface 31b. The second abutting surface 31b is formed such that the angle $\theta 2$ is smaller than the angle $\theta 1$. This can make the force necessary to connect the right cover 20R and the left cover 20L to each other smaller than the force necessary to separate the right cover 20R and the left cover 20L from each other.

As described above, the electronic apparatus 1 has the right cover 20R and the left cover 20L forming the upper surface of the electronic apparatus 1. The right cover 20R has, at an edge thereof, a plurality of engaging portion pairs including two first engaging portions 30 or 130 that are elastically deformed in opposite directions from each other. The first engaging portions 30 or 130 can be elastically deformed in a direction along the upper surface of the electronic apparatus 1, specifically the forward-rearward direction. The left cover 20L has a plurality of second engaging portions 40 at an edge of the left cover 20L. The second engaging portions 40 can be engaged with the first engaging portions 30 or 130. According to the electronic apparatus 1, a plurality of engaging portion pairs are provided at the edge of the right cover 20R, and therefore stability of connection of the two covers can be ensured. In addition, because the first engaging portions are elastically deformed in the second direction along the first external surface, interference between parts included in the electronic apparatus and the engaging structures of the two covers can be prevented.

It is to be noted that the present technology is not limited to the electronic apparatus 1 described above, but is susceptible of various changes.

For example, the projecting portions 35 may not necessarily be formed on the right cover 20R.

In addition, the shape of the first engaging portions 30 is not limited to the above-described shape. For example, the base portion of the second elastic inclining portion 32 may be connected to the projecting portion 35. Then, the second elastic inclining portion 32 may extend toward the edge of the right cover 20R, and the first elastic inclining portion 31 may extend from an end portion of the second elastic inclining portion 32 in a direction of going away from the edge of the right cover 20R. That is, the first engaging portion 30 may have substantially the shape of a U opened in the direction of going away from the edge of the right cover 20R.

The first engaging portions 30 may be formed on the left cover 20L, and the second engaging portions 40 may be formed on the right cover 20R.

A screw may be used to fix the left cover 20L.

The left cover 20L may not have the front surface portion 22, the side surface portion 24, or the rear surface portion 23.

The present disclosure contains subject matter related to that disclosed in Japanese Priority Patent Application JP 2013-121342 filed in the Japan Patent Office on Jun. 7, 2013, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   a first cover forming a first external surface of the electronic apparatus; a second cover forming the first external surface in conjunction with the first cover, the second cover being capable of being separated from an edge of the first cover in a first direction substantially parallel to the first external surface;
   a first cover protrusion having first and second lateral ends, the first cover protrusion being formed at the edge of the first cover and protruding toward the second cover in the first direction and laterally extending from the lateral end to the second lateral end substantially perpendicular to the first direction, each end having an elastically deformable engaging portion formed thereat; and
   first and second cover protrusions each having first and second lateral ends, each of the first and second cover protrusions being formed at an edge of the second cover and protruding toward the first cover in a direction opposing the first direction and each laterally extending from the first lateral end to the second lateral end substantially perpendicular to the first direction; the first and second cover protrusions being laterally separated from one another along the edge of the second cover to form a space laterally extending therebetween defined at one end by one of the lateral ends of the first cover protrusion and at another end by one of the lateral ends of the second cover protrusion each of the space defining ends the having an engaging portion engageabie with respective one of the elastically deformable engaging portions of the first cover protrusion, wherein
   each of the elastically deformable engaging portions of the first cover protrusion is elastically deformable in a second direction intersecting the first direction, the second direction being substantially parallel to the first external surface.

2. The electronic apparatus according to claim 1, wherein each engaging portion of the first cover protrusion includes
   a first abutting surface that a respective one of the engaging portions of the second cover protrusion abuts against when the second cover approaches the first cover,
   a second abutting surface that the respective one of the engaging portions of the second cover protrusion abuts against when the second cover is separated from the first cover,
   a first elastic inclining portion elastically inclined in the second direction by a force acting on the first abutting surface, and
   a second elastic inclining portion connected to the first elastic inclining portion, and elastically inclined in the second direction by a force acting on the second abutting surface.

3. The electronic apparatus according to claim 2, wherein the second elastic inclining portion and the first elastic inclining portion are connected to each other via a bent portion,
   the first abutting surface and the second abutting surface are provided to the first elastic inclining portion,
   an angle of the first abutting surface is set such that a moment around a base portion of the first elastic inclining portion is produced by the force acting on the first abutting surface, and
   an angle of the second abutting surface is set such that a moment around a base portion of the second elastic inclining portion is produced by the force acting on the second abutting surface.

4. The electronic apparatus according to claim 1, wherein one of the engaging portions of the first cover protrusion is elastically deformable in one direction of two directions opposite from each other in the second direction and another of the engaging portions of the first cover protrusion is elastically deformable in the other direction of the two directions.

5. The electronic apparatus according to claim 4, wherein the first cover protrusion is one of a plurality of first cover protrusions, and multiple engaging portions of first cover protrusions are elastically deformable in one direction of the two directions opposite from each other in the second direction and additional multiple engaging portions of first cover protrusions are elastically deformable in the other direction of the two directions.

6. The electronic apparatus according to claim 1, wherein at least one cover of the first cover and the second cover covers a replaceable part of the electronic apparatus, and
   the at least one cover has a first surface portion forming the first external surface of the electronic apparatus, a second surface portion forming a second external surface of the electronic apparatus, and a third surface portion forming a third external surface of the electronic apparatus.

7. The electronic apparatus according to claim 1, wherein the first cover has a plurality of first projecting portions extending to a lower side of the second cover to support the second cover,
   the second cover has a plurality of second projecting portions extending to a lower side of the first cover to support the first cover, and the plurality of first projecting portions and the plurality of second projecting portions are arranged alternately in a direction along the edges of the first cover and the second cover.

8. The electronic apparatus according to claim 7, wherein at least one projecting portion of the plurality of first projecting portions and the plurality of second projecting portions has an attaching portion fixed to a main body of the electronic apparatus.

9. A removable cover for an electronic apparatus, the removable cover forming a first external surface of the electronic apparatus in conjunction with a fixed cover attached to the electronic apparatus, the fixed cover having a fixed cover protrusion having first and second lateral ends, the fixed cover protrusion being formed at an edge of the fixed cover and protruding toward the removable cover in a first direction substantially parallel to the first external surface and laterally extending from its first lateral end to its second lateral end substantially perpendicular to the first direction, each end having an elastically deformable engaging portion formed thereat, the removable cover comprising:
 an edge combining with the edge of the fixed cover in the first direction; and
 first and second removable cover protrusions each having first and second lateral ends, each of the first and second removable cover protrusions being formed at the edge of the removable cover and protruding toward the fixed cover in a direction opposing the first direction and each laterally extending from the first lateral end to the second lateral end substantially perpendicular to the first direction, the first and second removable cover protrusions being laterally separated from one another along the edge of the removable cover to form a space laterally extending therebetween defined at one end by one of the lateral ends of the first removable cover protrusion and at another end by one of the lateral ends of the second removable cover protrusion, each of the space defining ends having an engaging portion engaging with a respective one of the elastically deformable, first-engaging portions of the fixed cover protrusion, wherein
 each of the engaging portions of the space defining ends has an abutting portion elastically deforming a corresponding one of the elastically deformable engaging portions of the fixed cover in a respective direction substantially parallel to the first external surface, each abutting portion facing in a respective direction that intersects the first direction, each respective direction that intersects the first direction being substantially parallel to the first external surface.

10. The removable cover for the electronic apparatus according to claim 9, wherein
 a plurality of projecting portions supporting the fixed cover, the plurality of projecting portions extending to a lower side of the fixed cover, are formed at the edge of the removable cover,
 the edge of the removable cover has portions supported by a plurality of projecting portions formed at the edge of the fixed cover, and
 the plurality of projecting portions of the removable cover are arranged alternately with the plurality of projecting portions of the fixed cover in a direction along the edges of the two covers.

11. The removable cover for the electronic apparatus according to claim 10, wherein
 each of the plurality of projecting portions of the removable cover has the engaging portion on one side and another side in a direction along the edge of the removable cover.

12. The removable cover for the electronic apparatus according to claim 9, the removable cover further comprising:
 a first surface portion forming the first external surface of the electronic apparatus;
 a second surface portion forming a second external surface of the electronic apparatus; and
 a third surface portion forming a third external surface of the electronic apparatus.

\* \* \* \* \*